United States Patent [19]

Komatu

[11] Patent Number: 4,633,095
[45] Date of Patent: Dec. 30, 1986

[54] MONOLITHIC SEMICONDUCTOR INTEGRATED A.C. SWITCH CIRCUIT

[75] Inventor: Yuji Komatu, Tokyo, Japan

[73] Assignee: NEC Corporation, Tokyo, Japan

[21] Appl. No.: 480,680

[22] Filed: Mar. 31, 1983

[30] Foreign Application Priority Data

Apr. 1, 1982 [JP] Japan .................................. 57-54706

[51] Int. Cl.[4] ......................... H03K 17/60; H03K 3/26
[52] U.S. Cl. .................................... 307/255; 307/270; 307/288; 307/313; 307/254
[58] Field of Search ............... 307/248, 253, 254, 255, 307/270, 288, 256, 596, 313; 381/123; 360/62

[56] References Cited

U.S. PATENT DOCUMENTS

| 3,937,987 | 2/1976 | Ahmed | 307/235 W |
| 4,137,428 | 1/1979 | Federico et al. | 179/1 SW |
| 4,464,589 | 8/1984 | Moriyasu et al. | 307/477 |

FOREIGN PATENT DOCUMENTS 2655237 8/1978 Fed. Rep. of Germany.

Primary Examiner—Stanley D. Miller
Assistant Examiner—Richard Roseen
Attorney, Agent, or Firm—Burns, Doane, Swecker & Mathis

[57] ABSTRACT

A monolithic bipolar semiconductor integrated switch circuit which does not require a high breakdown voltage construction or a biased substrate comprises a first terminal connected to a transmission line for transmitting a signal containing an a.c. signal, a second terminal connected to a reference potential point, a first transistor having an emitter connected to the first terminal, a second transistor having an emitter connected to the second terminal, and a collector connected to the collector of the first transistor. A drive circuit responsive to a control signal supplies at least one conduction signal to the bases of the first and second transistors to control the conductive states thereof. Advantageously, the switch circuit also includes a voltage supply terminal for supplying a voltage to the drive circuit, a unidirectional element for blocking current flow from the first terminal to the voltage supply terminal through the drive circuit, and a separate ground terminal to which a ground line for the drive circuit is connected. The drive circuit advantageously comprises a current mirror circuit which produces first and second constant current conduction signals for controlling the first and second transistors, respectively, and which is responsive to a control signal for activating the current mirror circuit.

9 Claims, 3 Drawing Figures

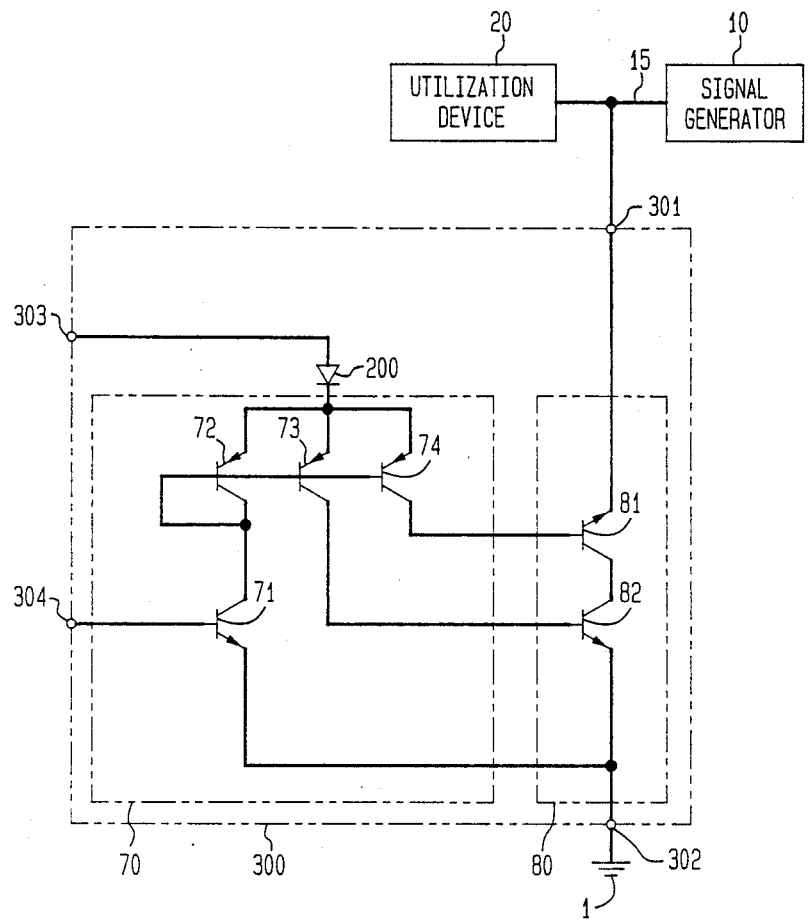

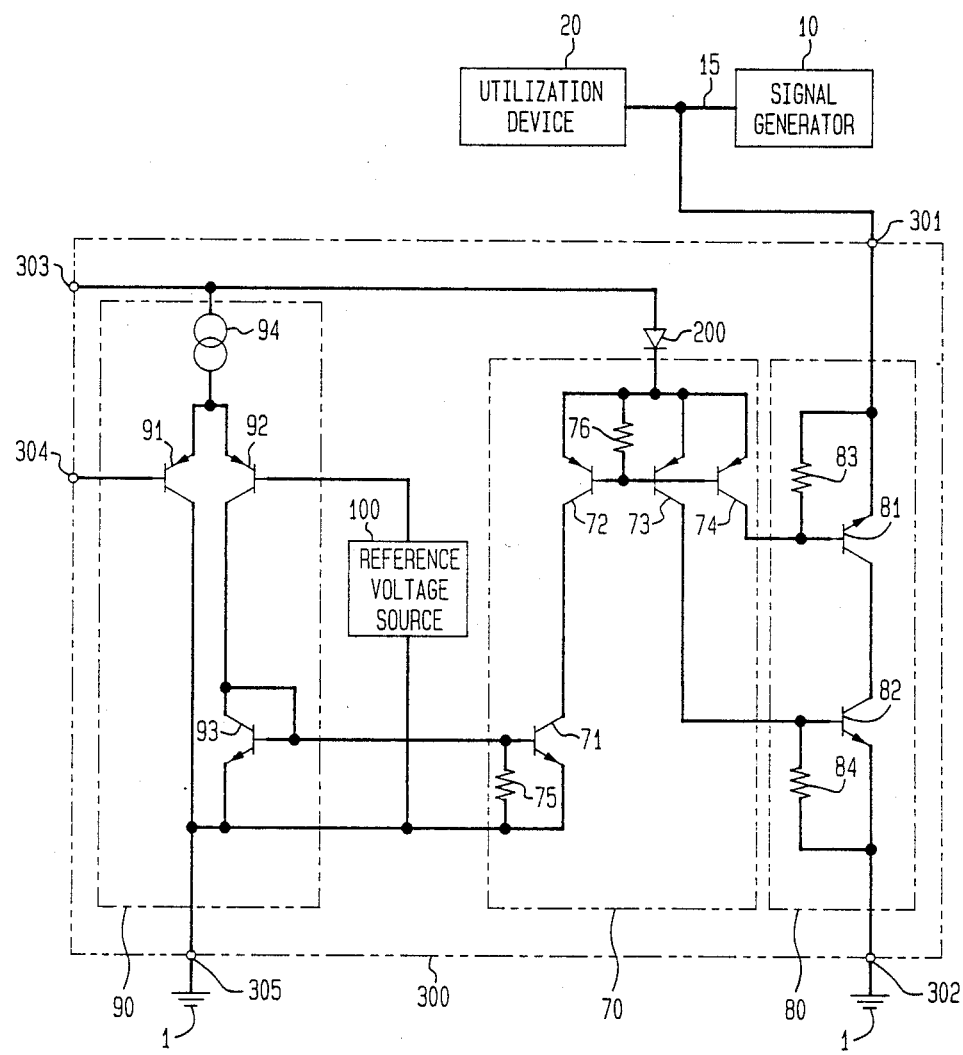

MONOLITHIC SEMICONDUCTOR INTEGRATED A.C. SWITCH CIRCUIT

BACKGROUND OF THE INVENTION

This invention relates to a switch circuit connected between a signal feed line and a reference potential (e.g. ground potential) for operatively short-circuiting the signal feed line to the reference potential line to interrupt the transmission of a signal through the signal feed line. More particularly, the present invention relates to a monolithic semiconductor integrated switch circuit suitable for operatively interrupting the transmission of a signal containing an a.c. signal of high voltage amplitude.

An audio tape recorder or a video tape recorder usually has a single magnetic head which is used in common for recording and for playback, with a recording switch and a playback switch which are used to change over the recording mode and the playback mode. The magnetic head has a first head terminal to which a recording amplifier and an a.c. bias oscillator as well as the playback switch are connected, and a second head terminal connected to a playback amplifier and the recording switch. In the playback mode, the first head terminal is grounded by turning the playback switch on. Thereby, a signal to be recorded from the recording amplifier and an a.c. bias signal from the bias oscillator are not supplied to the head. A signal recorded on a recording tape is played back via the head. In the recording mode, the second head terminal is grounded by turning the recording switch on, thereby to prohibit the playback signal output. A signal to be recorded and the a.c. bias signal are supplied to the head. In this manner, the two switches are interposed between the two head terminals and the ground line to change over the operation modes. For these switches, electronic switches including transistors are used, because mechanical switches are not reliable and generate chattering noises. Especially, bipolar transistors are used for the electronic switches because of their advantages of a small series resistance and a low residual voltage.

In the prior art, the collector and emitter of a bipolar transistor as the switching transistor are connected to the head terminal and to the ground, respectively. A switch-control signal is applied to the base of the switching transistor to control its conductivity. With respect to the switching transistor for the playback switch, the a.c. bias signal from the bias oscillator and the signal to be recorded are applied to its collector during the recording mode. Since the collector of the switching transistor in a monolithic integrated circuit device having the conventional P-N junction isolation structure must be isolated from a semiconductor substrate by the P-N junction, a voltage lower than the minimum voltage of the a.c. bias signal must be applied to the semiconductor substrate in order to maintain the reverse-bias to the P-N junction between the semiconductor substrate and the collector of the switching transistor to which the a.c. bias signal is applied. This also means that a large voltage higher than the peak-to-peak voltage of the a.c. bias signal is applied across the P-N junction between the semiconductor substrate and the collector. For these reasons, the integrated circuit device must be provided with a bias voltage source for generating the low voltage to be applied to the substrate and with a particular structure to enhance a breakdown voltage of the reverse-biased P-N junction higher than the above-mentioned large voltage. This is very disadvantageous, as compared with a normal integrated circuit device in which the semiconductor substrate is grounded and the collector of a transistor isolated from the substrate via a P-N junction receives a potential of one polarity.

SUMMARY OF THE INVENTION

It is therefore an object of the present invention to provide a switch circuit suitable for a monolithic integrated circuit having a conventional P-N junction isolation structure.

It is another object of the present invention to provide an integrated a.c. switch circuit operatively interrupting the transmission of a signal containing an a.c. signal of a large amplitude through a signal transmission line.

The switch circuit in accordance with the present invention comprises a first terminal connected to a signal transmission line through which a signal containing an a.c. signal is transmitted, a second terminal connected to a reference potential point, a first transistor whose emitter is connected to the first terminal, a second transistor whose emitter is connected to the second terminal and whose collector is connected to the collector of the first transistor, and a drive circuit supplying a control signal to the bases of the first and second transistors to control the conductivities of the first and second transistors.

When a control signal having a first state is applied to the bases of the first and second transistors from the drive circuit to make them conductive, the first terminal is substantially short-circuited to the second terminal. Accordingly, the signal containing the a.c. signal is bypassed from the first terminal to the second, whereby the signal transmission through the signal transmission line is interrupted. When the drive circuit generates another control signal of a second state to turn off the first and second transistors, the first and second terminals are separated from each other. Accordingly, the signal containing the a.c. signal is transmitted through the signal transmission line. In this case, the first terminal changes its polarity between positive and negative in accordance with the a.c. signal. The switch circuit according to the present invention is advantageously constructed as a monolithic semiconductor integrated circuit device, and the collector of the first transistor is formed in a semiconductor substrate, isolated therefrom by a P-N junction, with its base and emitter being formed in the collector. The emitter of the first transistor is connected to the first terminal. Therefore, the a.c. signal does not forwardly bias the P-N junction isolating the collector of the first transistor from the substrate. Accordingly, it is not necessary to apply a voltage below the minimum negative voltage of the a.c. signal to the substrate of the monolithic integrated circuit device. A ground voltage may be applied to the substrate. In other words, the reverse-biased P-N junction having the high breakdown voltage and the bias voltage source are no longer necessary.

The collector of the first transistor is not connected to the reference potential point but to the collector of the second transistor. The emitter of the second transistor is connected to the reference potential point via the second terminal. Accordingly, when the control signal having the second state is applied, the base-emitter junction of the second transistor is reversely biased, so that the second transistor maintains the cut-off state. In other words, the collector of the first transistor is under a floating state. Therefore, neither the positive nor negative voltage of to the a.c. signal applied to the emitter of the first transistor via the first terminal produces current passage between the collector and emitter of the first transistor. The first and second transistors keep the cut-off state. As a result, the signal appearing at the first terminal does not flow to the second terminal.

In the switch circuit in accordance with the present invention, a unidirectional element is favorably interposed between the drive circuit and a power supply terminal in order to block a signal path which may otherwise be formed from the emitter of the first transistor via the drive circuit to the power supply terminal by the a.c. signal applied to the first terminal. In other words, the application of the signal to the drive circuit via the emitter-base junction of the first transistor is prevented.

As described above, the switch circuit in accordance with the present invention is suitable for the monolithic integrated circuit device. Moreover, the signal containing the a.c. signal is transmitted with certainly through the signal transmission line when the first and second transistors are turned off.

These and other objects, features and advantages of the present invention will become more apparent from the following description taken in conjunction with the accompanying drawings.

BRIEF DESCRIPTION OF THE DRAWINGS

FIG. 2 is a circuit diagram showing one preferred embodiment of the present invention; and FIG. 3 is a circuit diagram showing another preferred embodiment of the present invention.

DETAILED DESCRIPTION OF THE PRIOR ART

Figure 1:
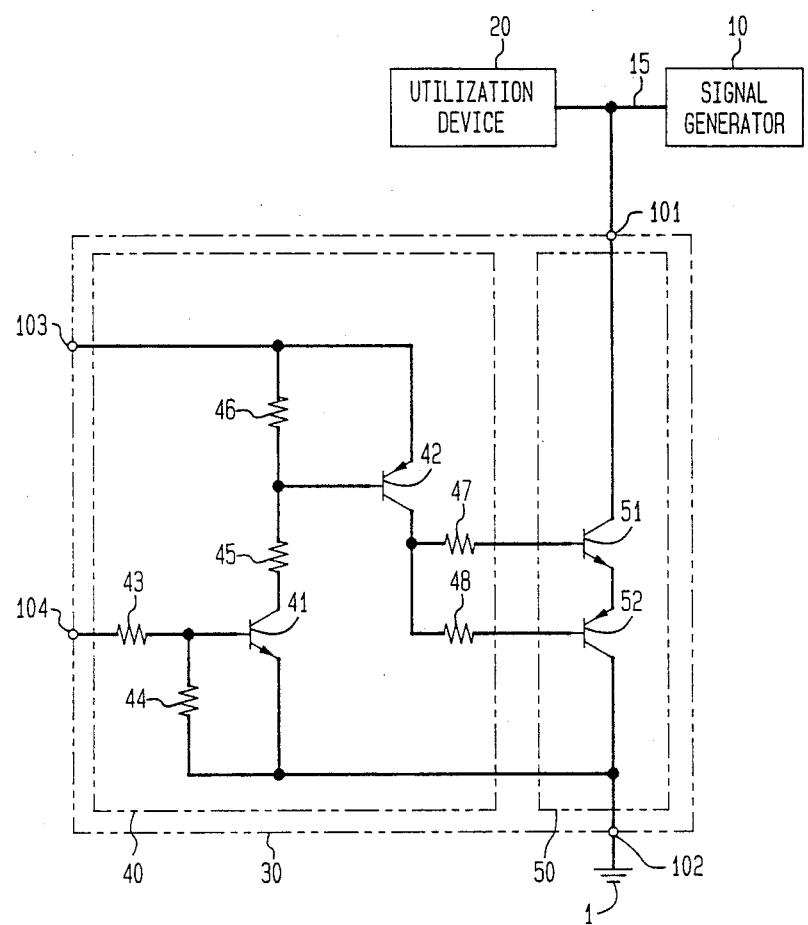
FIG. 1 is a circuit diagram of the semiconductor switch circuit in accordance with the prior art.

The prior art switch circuit consisting of a plurality of discrete components will be explained with reference to FIG. 1. A signal containing an a.c. signal is applied from a signal generation circuit 10 to a utilization device 20 via a signal transmission line 15. The switch circuit 30 having a switch terminal 101, a ground terminal 102, a power supply terminal 103 and a control terminal 104 is interposed between the signal transmission line 15 and a ground potential point 1. The switch terminal 101 is connected to the signal transmission line 15 and the ground terminal 102 is connected to the ground potential point 1. The switch circuit 30 also includes a semiconductor switch 50 and a drive circuit 40 for driving the switch 50. The semiconductor switch 50 consists of an NPN transistor 51 and a PNP transistor 52. The collectors of these transistors 51, 52 are connected to the terminals 101, 102, respectively, and their emitters are connected to each other. The drive signal from the drive circuit 40 is applied to the bases of the transistors 51, 52. The drive circuit 40 consists of an NPN transistor 41, a PNP transistor 42 and six resistors 43 through 48. The base of the transistor 41 is connected to the control terminal 104 via the resistor 43 and the emitter is connected to the terminal 102. The resistor 44 is connected between the base and emitter of the transistor 41. The collector of the transistor 41 is connected to the terminal 103 via the resistors 45 and 46. The base-emitter path of the transistor 42 is connected in parallel to the resistor 46, and its collector is connected to the bases of the transistors 51, 52 via the resistors 47, 48, respectively.

When a control signal having a first level greater than the threshold voltage of the transistor 41 is applied to the terminal 104, the transistor 41 becomes conductive, and the transistor 42 is also conductive. Hence, the base current is applied to the transistors 51, 52 from the terminal 103, so that they become conductive. As a result, the terminal 101 is connected to the ground terminal 102 via the transistors 51, 52, and the signal current from the signal generator 10 flows to the reference potential point 1 through the terminal 101, the transistors 51, 52 and the terminal 102, thereby interrupting the feed of the signal to the utilization device 20.

When a control signal having a second level lower than the threshold voltage of the transistor 41 (such as a ground potential, for example) is applied to the terminal 104, all the transistors 41, 42, 51 and 52 become non-conductive and the terminal 101 is separated from the terminal 102. Accordingly, the signal from the signal generator 10 is applied to the utilization device 20 through the signal transmission line 15. In this instance, the potential at the terminal 101 is changed in accordance with the signal voltage from the signal generator 10.

In the video tape recorder and audio tape recorder described in the foregoing, the utilization device 20 and the switch circuit 30 correspond to the voice recording/playback head and the playback switch, respectively, and the signal generator 10 has the recording amplifier and the a.c. bias oscillator. In the recording mode, the transistors 51, 52 are non-conductive by the control signal of the second level applied to the terminal 104. The a.c. bias signal is applied to the head (utilization device 20) through the transmission line 15 together with the signal to be recorded from the signal generator 10. Hence, the a.c. bias signal for recording is applied to the collector of the transistor 51 through the terminal 101.

The prior art switch circuit 30 shown in FIG. 1 consists of discrete components. It is not constructed as the integrated circuit device. In other words, transistors having a sufficiently high breakdown voltage must be used for the transistors 51 and 52. This is because the transistors 51, 52 should keep the non-conductive state and the terminal 101 be isolated from the terminal 102 even when the signal containing a high voltage a.c. bias signal is applied to the terminal 101 as in the audio or video tape recorder. It is true that the switch circuit of the monolithic circuit configuration is much more preferred because the switch circuit 30 consisting of a plurality of discrete components is much more expensive. However if the switch circuit 30 shown in FIG. 1 is formed as a bipolar monolithic integrated circuit device having the conventional P-N junction isolation structure, the following problems arise.

In the bipolar monolithic integrated circuit, an N-type epitaxial layer formed on a P-type substrate is electrically divided into a plurality of island regions, by a P-type isolation region with P-N junctions between the respective N-type island regions and the P-type substrate and isolation region. Circuit elements such as transistors, resistors, etc. are formed in these island regions, respectively. In order to electrically isolate the island regions from each other, it is necessary to reversely bias the P-N junction between the island regions and the P-type substrate and isolation region. The bipolar transistors in the monolithic integrated circuit device use the island regions as their collector regions.

Accordingly, if the switch circuit of FIG. 1 is constructed as the monolithic integrated circuit device, the positive and negative voltages of the a.c. signal generated by the signal generator 10 are applied to the island region in which the transistor 51 is formed, via the terminal 101. To electrically isolate the island region of this transistor 51, a voltage lower than the minimum negative voltage of the a.c. signal should be applied to the substrate. The a.c. bias signal for recording has a voltage amplitude of ±50 V. In other words, it is necessary to apply a voltage below −50 V to the substrate. Consequently, a voltage as large as at least 100 V is applied across the P-N junction between the substrate and the island region which serves as the collector of the transistor 51. For this reason, the isolating P-N junctions in the monolithic integrated circuit device must withstand a high voltage of at least 100 V. In order to obtain a high breakdown voltage of at least 100 V between the substrate and the island region, it is conceivable for example, to reduce remarkably the impurity concentration of the island region. However, this method would result in the increase in the collector series resistance of the transistor 51, and when the transistors 51 and 52 are turned on, a considerably high impedance would be coupled between the terminal 101 and the terminal 102 with the result of a leakage of the signal from the signal generator 10 to the utilization device 20. Moreover, a bias voltage source should be prepared externally in order to apply a voltage of lower than −50 V to the substrate.

DETAILED DESCRIPTION OF THE PREFERRED EMBODIMENTS

A preferred embodiment of the present invention will be described with reference to FIG. 2, in which like reference numerals are used to identify like constituents as in FIG. 1 and the explanation thereof is omitted. The switch circuit shown in FIG. 2 is constructed as a monolithic integrated circuit device 300. This device 300 includes four external terminals, i.e., a switch terminal 301, a ground terminal 302, a power supply terminal 303 and a control terminal 304. The switch terminal 301 is connected to the signal transmission line 15. The ground terminal 302 is connected to the reference potential (ground potential) point 1. A power source voltage $V_{cc}$ is applied to the power supply terminal 303, and a control signal for activating the switch circuit is applied to the control terminal 304.

The integrated circuit device 300 as the switch circuit includes also a semiconductor switch 80 and a drive circuit 70. The semiconductor switch 80 consists of two NPN transistors 81 and 82. The emitters of these transistors are connected to the terminals 301 and 302, respectively, and their collectors are connected to each other. The drive circuit 70 consists of one NPN transistor 71 and three PNP transistors 72, 73 and 74. The transistors 73 and 74 feed the base currents of the transistors 81 and 82, respectively. The transistor 72 is diode-connected so that the transistors 72, 73 and 74 form a current mirror circuit. Since the transistors 81 and 82 are current-driven by the current mirror circuit, the linearity of the series ON resistances of the transistors 81 and 82 at the time of switch-on can be improved. In addition, the stability of their base currents with respect to the changes in the power supply voltage and temperature can also be improved. The base, collector and emitter of the transistor 71 are connected to the control terminal 304, the collector of the diode-connected transistor 72 and the ground terminal, respectively. A diode 200 having an anode connected to the power supply terminal 303 is interposed between the drive circuit 70 and the terminal 303.

When the control signal having a first level higher than the threshold voltage of the transistor 71 is applied to the control terminal 304, the transistor 71 is turned on, and the transistors 72 to 74 are also turned on. Hence, the transistors 81 and 82 are turned on by a constant base current from the current mirror circuit consisting of the transistors 72 to 74. As a result, the terminal 301 is connected to the ground terminal 302 with an extremely low impedance to interrupt the signal transmission from the signal generation circuit 10 to the utilization device 20 through the transmission line 15. If the utilization device 20, the signal generator 10 and the integrated circuit device 300 are supposed to be the voice head, the recording signal generating portion with an a.c. bias signal source and the playback switch in the audio or video tape recorder, respectively, this state corresponds to the playback mode.

When the control signal having a second level lower than the threshold voltage of the transistor 71 is applied, the transistors 71 to 74 are turned off and the transistors 81 and 82 are also turned off. Hence, the terminal 301 is separated from the terminal 302 to supply the signal from the signal generator 10 to the utilization device 20. This state corresponds to the recording mode in the case of the audio or video tape recorder. In this instance, an a.c. high voltage signal such as the a.c. bias signal for recording is applied to the terminal 301. The emitter of the transistor 81 is connected to the terminal 301. In other words, the high a.c. signal voltage is not applied to the island region in which the transistor 81 is formed. Accordingly, the island regions for the transistors 71 to 74, 81 and 82 are isolated from one another by connecting the substrate of the integrated circuit device 300 to the ground. This arrangement elminates the high breakdown voltage structure of the device 300 and the bias voltage source for the substrate.

The high a.c. signal voltage is applied to the emitter instead of the collector of the transistor 81. The reverse bias voltage between the base and emitter of the transistor 81 is low. Hence, the base potential of the transistor 81 increases with the increase in the voltage of the a.c. signal applied to the terminal 301 although the transistor 81 is turned off.

It will be now assumed that the transistor 82 is absent and the collector of the transistor 81 is directly connected to the terminal 302 which is grounded. As described previously, the base voltage of the transistor 81 is increased by the a.c. voltage applied to its emitter. Accordingly, the base-collector junction of the transistor 81 is forwardly biased to produce a current passage via the emitter-base and base-collector junctions of the transistor 81 between the terminals 301 and 302. As a result, the signal at the terminal 301 flows to the terminal 302 although the transistor 81 is turned off.

In FIG. 2, however, the collector of the transistor 81 is not directly connected to the ground terminal 302 but is connected to the collector of the transistor 82. In other words, the collector of the transistor 81 is under a floating state. Moreover, the emitter of the transistor 82 is grounded and is under the off state. Accordingly, the transistors 81 and 82 keep the off state irrespective of the a.c. voltage applied to the terminal 301. As a result, the signal from the signal generator 10 is not leaked to the terminal 302 through the terminal 301 but is applied with certainty to the utilization device 20.

The increase in the voltage at the base of the transistor 81 raises the collector voltages of the transistor 74. Since the transistor 74 is of PNP type, the voltage at its base is also increased with the increase in its collector voltage. Assume now that the diode 200 is not provided. When the base voltage of the transistor 74 becomes higher than the reverse voltage between its base and emitter due to the increase in the a.c. voltage applied to the terminal 301, the current passage is generated from the base of the transistor 81 to the power terminal 303. In other words, a current path is formed from the terminals 301 to 303. As a result, the signal at the terminal 301 leaks to the terminal 303. However, the diode 200 is disposed between the terminal 303 and the drive circuit 70; therefore, the increase in the base voltage of the transistor 74 reversely biases the diode 200. Consequently, the current path is not produced between the terminals 301 and 303. In other words, when the transistor 71 is kept off by the control signal lower than the threshold voltage of the transistor 71 (the signal of the ground level), no current passage is generated from the transistor 74 to either the control terminal 303 or the ground terminal 302. That is to say, the collector of the transistor 74 is under the floating state. Accordingly, the inflow of the signal from the terminal 301 to the drive circuit 70 does not exist. By using the base-collector junction of a transistor as the diode 200, it becomes possible to give the diode 200 such a breakdown voltage that the avalanche breakdown does not occur even when the high a.c. voltage such as the a.c. bias signal for recording is applied to the terminal 301.

When the a.c. voltage applied to the terminal 301 changes in the negative direction, the emitter and base voltages of the transistor 81 also become negative. Since the transistors 74 and 82 are kept off, the transistor 81 keeps the off state.

FIG. 3 shows another embodiment of the present invention, in which like reference numerals are used to identify like constituents as in FIGS. 1 and 2 and the explanation thereof is omitted. In addition to the effects brought forth by the switch circuit shown in FIG. 2, the switch circuit shown in FIG. 3 provides the following effects. The first additional effect is that the switching speed of the switch circuit with respect to the control signal become faster. The second effect is that an a.c. signal having a higher amplitude voltage can be interrupted. The third is that the potential at the terminal 301 at the time of the on-state of the switch 80 can be brought more closer to the ground potential.

For the first effect, the monolithic integrated switch circuit 300 shown in FIG. 3 includes a comparator 90 and a reference voltage source 100 that are incorporated in the integrated circuit device 300. The comparator 90 compares the control signal from the control terminal 304 with the reference voltage from the reference voltage source 100 and actuates the transistor 71 by its comparison output. The comparator 90 consists of a pair of PNP transistors 91 and 92 whose emitters are coupled in common to the power supply terminal 303 via a constant current source 94 to form a differential amplifier, and a diode-connected NPN transistor 93 coupled between the collector of the transistor 92 and the ground. The bases of the transistors 91 and 92 are connected to the control terminal 304 and the output of the reference voltage source 100, respectively, and their collectors to the ground and the base of the transistor 71, respectively. In the circuit shown in FIG. 2, the control signal from the control terminal 304 is compared with the threshold voltage of the transistor 71 to control the on/off state of the transistor 71. In the circuit shown in FIG. 3, however, the control signal is compared with the reference voltage from the reference voltage source 100, and the difference thereof is amplified by the transistors 91 and 92 and applied to the transistor 71. Therefore, the switch circuit shown in FIG. 3 has a sharper switching performance than that of the switch circuit shown in FIG. 2.

The second additional effect described above, is achieved by resistors 75, 76, 83 and 84 which are inserted in parallel with the base-emitter passages of the transistors 71, 74 (72, 73), 81, and 82, respectively. Collector-emitter breakdown voltages of a transistor are classified into two: the first is a voltage $BV_{CEO}$ on the base open condition and the second is a voltage $BV_{CER}$ when a resistor is connected between its base and emitter, and the relationship of $BV_{CEO} < BV_{CER}$ exists between them. Since the resistors 75, 76, 83, and 84 are respectively connected between the bases and emitters of the transistors 71, 74, 81 and 82 to which the high a.c. voltage at the terminal 301 is applied, an a.c. signal having an amplitude voltage higher than that of the a.c. signal in the case of the circuit shown in FIG. 2 can be applied to the terminal 301. In other words, the switch circuit of FIG. 3 can be used for switching a higher a.c. signal.

For the third effect, an additional ground terminal 305 is provided as an external lead terminal of the integrated circuit device 300. The ground line in the drive circuit 70 is connected to the terminal 305. The ground lines of the comparator 90 and the reference voltage source 100 are also connected to this terminal 305. There is an inherent impedance in a bonding wire connecting the ground terminal 302 as an external lead terminal and a ground electrode pad on an integrated circuit chip. For this, reason, the emitter of the transistor 82 in the circuit of FIG. 2 in which the substrate of the integrated circuit 300 is connected to the terminal 302 takes a potential higher than the ground potential due to the fact that currents from the drive circuit 70 and from the switch 80 as well as a current flowing through the substrate flow via the ground electrode pad into the bonding wire. In other words, the potential at the terminal 301 does not take the ground potential even if the transistors 81 and 82 are turned on to obtain the on-resistance of zero.

In FIG. 3, the ground line of the drive circuit 70 is not connected to the terminal 302 but to the terminal 305, and the substrate of the integrated switch circuit 300 is also connected to the terminal 305. It is only a current from the resistor 84 and the emitter of the transistor 82 that flows through the terminal 302. Accordingly, when the transistors 81 and 82 are turned on, the potential of the terminal 301 becomes substantially the ground potential.

As described in the foregoing, the switch circuit in accordance with the present invention is suitable, for the bipolar monolithic integrated circuit device having the conventional P-N junction isolation structure. Further, the switch circuit prevents the signal from flowing through the passages other than through the signal transmission line when the switch circuit is opened.

The present invention can be practised in various modified manners without departing from the spirit and scope thereof and without being limited by the foregoing embodiments. For example, if the substrate is of the N-type, the conductivity type of each transistor is changed to the opposite type. In the description concerning FIG. 2, the transistor 71 is driven by a voltage of the control signal. In such a voltage drive, a current limiting resistor is favorably provided in the collector current path of the transistor 71. If the transistor 71 is driven by a constant current, the current limiting resistor is unnecessary. In FIG. 3, the transistor 71 is driven by a constant current.

What is claimed is:

1. A monolithic bipolar semiconductor integrated circuit comprising a switch terminal; a first ground terminal; a first transistor having an emitter connected to said switch terminal, a base and a collector; a second transistor having an emitter connected to said first ground terminal, a base, and a collector connected to the collector of said first transistor; a second ground terminal; a drive circuit for generating at least one drive signal, said drive circuit having a ground line connected to said second ground terminal; means for applying said at least one drive signal to the bases of said first and second transistors; a power supply terminal; and a diode supplying a voltage at said power supply terminal through its forward current path to said drive circuit.

2. The circuit claimed in claim 1 further comprising a first resistor connected between the base and the emitter of said first transistor, and a second resistor connected between the base and the emitter of said second transistor.

3. A monolithic bipolar semiconductor integrated switch circuit comprising a switch terminal, a reference potential terminal, a switch means coupled between said switch terminal and said reference potential terminal for producing a current path with a low impedance between said switch terminal and said reference potential terminal in response to first and second constant current conduction signals, current mirror means for generating said first and second constant current conduction signals in response to a control signal, a voltage supply terminal, current control means coupled between said voltage supply terminal and said current mirror means for blocking a current from said current mirror means to said voltage supply terminal and feeding a current from said voltage supply terminal to said current mirror means, said switch means including a first transistor having an emitter coupled to said switch terminal and a second transistor having an emitter coupled to said reference potential terminal and a collector coupled to a collector of said first transistor, and means for applying said first and second constant current conduction signals to bases of said first and second transistors, respectively.

4. The switch circuit of claim 3 further comprising control means responsive to said control signal for controlling said current mirror means.

5. The switch circuit of claim 4 wherein said control means comprises comparator means for comparing the control signal with a reference signal and for producing an output proportional to a difference therebetween, and transistor means connected to said current mirror means for controlling activation thereof in response to the output of said comparator means.

6. The switch circuit of claim 5 wherein said comparator means comprises third and fourth transistors having emitters connected together to said voltage supply terminal via constant current source means, a collector of said third transistor being connected to a ground and a collector of said fourth transistor being connected to said ground via a diode-connected transistor, the output of said comparator means appearing on the collector of said fourth transistor, a base of said third transistor being connected to said control signal terminal and a base of said fourth transistor being connected to said reference signal, and the collector of said fourth transistor being connected to an input of said transistor means.

7. An electronic switch circuit comprising a switch terminal; a reference potential terminal; a switch control terminal; a first transistor having an emitter connected to said switch terminal, a base, and a collector; a second transistor having an emitter connected to said reference potential terminal, a base, and a collector connected to the collector of said first transistor; and a drive circuit coupled to said switch control terminal and supplying drive currents to the bases of said first and second transistors in response to a first state at said switch control terminal; said drive circuit controlling the bases of said first and second transistors to place said first and second transistors in an off state in response to a second state at said switch control terminal; said drive circuit including a current mirror circuit having a current input terminal, a first current output terminal connected to the base of said first transistor, and a second current output terminal connected to the base of said second transistor, said drive circuit further including an input circuit coupled between said current input terminal and said switch control terminal, said input circuit producing an input current to said current input terminal in response to said first state at said switch control terminal.

8. A monolithic integrated switch circuit comprising a switch terminal; a reference terminal; a power supply terminal; a switch control terminal supplied with a switching signal, a circuit node, a first transistor having an emitter connected to said switch terminal, a second transistor having an emitter connected to said reference terminal and a collector connected to a collector of said first transistor, a third transistor having a collector-emitter current path connected between a base of said first transistor and said circuit node, a fourth transistor having a collector-emitter current path connected between a base of said second transistor and said circuit node, a diode connected between said circuit node and said power supply terminal, and actuating means coupled between said switch control terminal and said circuit node for supplying a conduction signal to bases of said third and fourth transistors to actuate said third and fourth transistors when said switching signal is supplied.

9. The circuit as claimed in claim 8, wherein said actuating means includes a fifth transistor connected in a diode form to constitute a current mirror circuit in combination with said third and fourth transistors.

* * * * *